United States Patent
Lee et al.

(10) Patent No.: US 10,014,828 B1
(45) Date of Patent: Jul. 3, 2018

(54) TRANSMITTER SYSTEM AND METHOD OF CALIBRATION

(71) Applicant: GLOBALFOUNDRIES Inc., Grand Cayman (KY)

(72) Inventors: See Lee, Allen, TX (US); Abdellatif Bellaouar, Richardson, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/659,352

(22) Filed: Jul. 25, 2017

(51) Int. Cl.
| | |
|---|---|
| *H04B 1/28* | (2006.01) |
| *H03F 1/02* | (2006.01) |
| *H03F 1/32* | (2006.01) |
| *H03F 3/24* | (2006.01) |
| *H04W 52/18* | (2009.01) |
| *H04L 27/36* | (2006.01) |

(52) U.S. Cl.
CPC ......... *H03F 1/0255* (2013.01); *H03F 1/0272* (2013.01); *H03F 1/3205* (2013.01); *H03F 3/24* (2013.01); *H04L 27/366* (2013.01); *H04W 52/18* (2013.01); *H03F 2200/123* (2013.01)

(58) Field of Classification Search
CPC .... H03F 1/0255; H03F 1/0272; H03F 1/3205; H03F 3/24; H03F 2200/123; H04L 27/366
USPC .......... 455/91, 326, 333; 327/540, 541, 543, 327/328
See application file for complete search history.

(56) References Cited

U.S. PATENT DOCUMENTS

| | | | |
|---|---|---|---|
| 6,181,170 B1* | 1/2001 | Koifman | H04L 25/0272 327/108 |
| 8,493,136 B2 | 7/2013 | Bellaouar et al. | |
| 9,276,798 B2* | 3/2016 | Yu | H04L 27/364 |
| 9,531,335 B2* | 12/2016 | Subramaniyan | H03F 1/301 |
| 2007/0293163 A1* | 12/2007 | Kilpatrick | H04B 1/0483 455/84 |
| 2012/0046004 A1* | 2/2012 | Mirzaei | H03F 1/0277 455/118 |
| 2013/0266045 A1* | 10/2013 | Lakkis | H04B 1/30 375/219 |
| 2013/0321057 A1* | 12/2013 | Soussan | H01L 27/1203 327/319 |
| 2015/0270393 A1* | 9/2015 | Kumar | H01L 29/7831 327/157 |

* cited by examiner

*Primary Examiner* — Sonny Trinh
(74) *Attorney, Agent, or Firm* — David Cain; Hoffman Warnick LLC

(57) ABSTRACT

Embodiments of the present disclosure provide a transmitter system including: a source follower (SF) sub-stage having a pair of transistors, one being coupled to a biasing voltage at a gate terminal thereof, and the other including a fully depleted semiconductor on insulator (FDSOI) transistor coupled to an input signal at a gate terminal thereof, and coupled to a calibration voltage at a back-gate terminal thereof. A mixer sub-stage includes a mixer input node coupled to the SF output node of the pair of transistors of the SF sub-stage, and the mixer input node is electrically coupled in parallel to two FDSOI mixer transistors, with the FDSOI mixer transistor being electrically coupled to a respective back-gate voltage. The FDSOI mixer transistors each include a gate terminal coupled to an input voltage, while a second source/drain terminal of the FDSOI mixer transistors are each electrically coupled to a mixer output node.

20 Claims, 10 Drawing Sheets

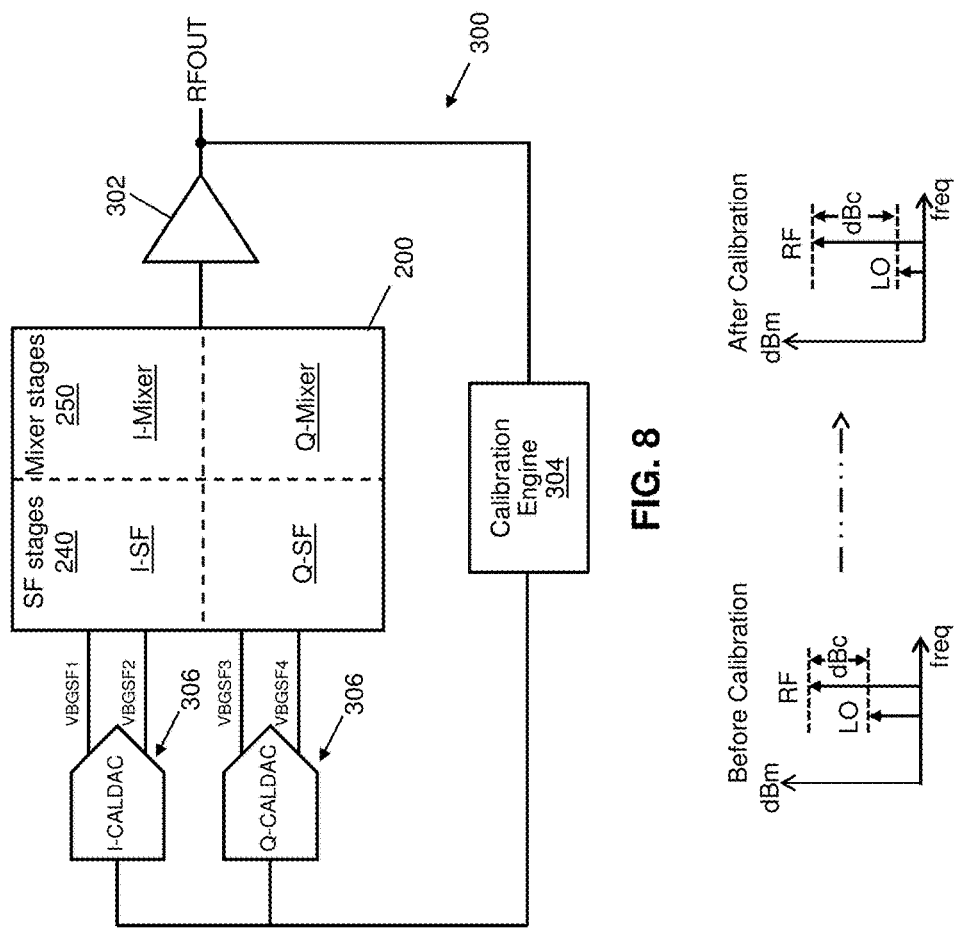

US 10,014,828 B1

TRANSMITTER SYSTEM AND METHOD OF CALIBRATION

TECHNICAL FIELD

Embodiments of the disclosure relate generally to signal transmitter technology, and more particularly, to transmitter systems and methods for transmitter calibration. The various embodiments described herein can be used in a variety of applications, e.g., signal transmission applications with wirelessly networked hardware.

BACKGROUND

In electrical hardware, a transistor is a critical component for implementing digital and analog circuitry designs. Generally, a transistor includes three electrical terminals: a source, a drain, and a gate. By applying different voltages to the gate terminal, the flow of electric current between the source terminal and the drain terminal of the transistor can be switched on or off. The presence or absence of an applied voltage at the gate terminal of a transistor can be identified as "on" and "off" states of the transistor. Thus, transistors can serve as a switching element in various circuit designs, e.g., by manipulating a voltage applied to the gate of each transistor and thereby affecting the flow of electrical current between source and drain terminals of each transistor. These attributes cause a transistor to be a fundamental component in electronic circuitry, e.g., RF amplifiers, transmitters, oscillators, filters, etc.

Transistor design and placement can influence the electrical behavior of interconnected elements in an electronic circuit. The use of multiple interconnected devices over a wide area, colloquially known as "internet of things" or "IOT," is a rapidly growing area of electronics engineering. Each interconnected device in an IOT arrangement can include one or more power amplifiers to provide signal transmission and reception with respect to other devices in the same network. Each device can be structured to operate with reduced power consumption until signals are transmitted or received, e.g., using an antenna-transceiver assembly. In transmitter components of such assemblies, it may be desirable to provide a lower power consumption for upconverter applications while maintaining relatively large input and output voltages, e.g., to achieve a high signal-to-noise ratio (SNR) at the transmitter output. Conventional devices for achieving such outputs may include passive mixer circuits using a traditional "zero threshold voltage" architecture, e.g., devices which provide an approximately zero threshold voltage for governing a signal mixing component, but which typically require higher channel lengths or may be susceptible to signal losses. Interconnected source follower components for increasing the transmitter's linearity may address some of these constraints, but introduce series resistor assemblies which may have a higher amount of signal noise. In conventional assemblies, the supply voltage to the transmitter assembly may need to be increased, or more complicated circuit architectures must be used.

SUMMARY

A first aspect of the present disclosure provides a transmitter system including: a source follower (SF) sub-stage having a pair of transistors electrically coupled to each other at an SF output node via respective source/drain terminals, wherein one transistor of the pair of transistors is coupled to a biasing voltage at a gate terminal thereof, and wherein another transistor of the pair of transistors includes a fully depleted semiconductor on insulator (FDSOI) transistor coupled to an input signal at a gate terminal thereof, and coupled to a calibration voltage at a back-gate terminal thereof; and a mixer sub-stage having a mixer input node coupled to the SF output node of the pair of transistors of the SF sub-stage, wherein the mixer input node is electrically coupled in parallel to a first source/drain terminal of a first FDSOI mixer transistor and a first source/drain terminal of a second FDSOI mixer transistor, each of the first and second FDSOI mixer transistors being electrically coupled to a respective back-gate direct current (DC) voltage source, wherein the first and second FDSOI mixer transistors each include a gate terminal coupled to an input voltage, and wherein a second source/drain terminal of the first FDSOI mixer transistor and a second source/drain terminal of the second FDSOI mixer transistor of the mixer sub-stage are each electrically coupled to a mixer output node.

A second aspect of the present disclosure provides a transmitter apparatus including: a transmitter system having an I-mixer assembly and a Q-mixer assembly therein, and wherein the I-mixer assembly and the Q-mixer assembly each include: a pair of source follower (SF) sub-stages each having a pair of transistors electrically coupled to each other at an SF output node via respective source/drain terminals, wherein one transistor of the pair of transistors is coupled to a biasing voltage at a gate terminal thereof, and wherein another transistor of the pair of transistors comprises a fully depleted semiconductor on insulator (FDSOI) transistor coupled to an input signal at a gate terminal thereof, and coupled to a calibration voltage at a back-gate terminal thereof, and a pair of mixer sub-stages each having a mixer input node coupled to the SF output node of the pair of transistors of a respective SF sub-stage, wherein the mixer input node is electrically coupled in parallel to a first source/drain terminal of a first FDSOI mixer transistor and a first source/drain terminal of a second FDSOI mixer transistor, each of the first and second FDSOI mixer transistors being electrically coupled to a respective back-gate direct current (DC) voltage source, wherein the first and second FDSOI mixer each include a gate terminal coupled to an input voltage, and wherein a second source/drain terminal of the first FDSOI mixer transistor and a second source/drain terminal of the second FDSOI mixer transistor of each mixer sub-stage is each electrically coupled to a respective mixer output node; a preamplifier having an amplification input electrically coupled to the mixer output node of the I-mixer assembly and the Q-mixer assembly, wherein an output from the preamplifier defines an amplification output node; and a calibration engine electrically coupled to the amplification output node, wherein the calibration engine transmits a forward bias or a reverse bias as the calibration voltage to the SF sub-stage based on output signal at the amplification output node.

A third aspect of the present disclosure provides a method for calibrating a transmitter system, the method including: applying an input signal to an input node of the transmitter system, wherein the transmitter system includes an I-mixer assembly and a Q-mixer assembly, and wherein the I-mixer assembly and the Q-mixer assembly each include: a pair of source follower (SF) sub-stages each having a pair of transistors electrically coupled to each other at an SF output node via respective source/drain terminals, wherein one transistor of the pair of transistors is coupled to a biasing voltage at a gate terminal thereof, and wherein another transistor of the pair of transistors comprises a fully depleted semiconductor on insulator (FDSOI) transistor coupled to an input signal at a gate terminal thereof, and coupled to a calibration voltage at a back-gate terminal thereof, and a pair of mixer sub-stages each having a mixer input node coupled to the SF output node of the pair of transistors of a respective SF sub-stage, wherein the mixer input node is electrically coupled in parallel to a first source/drain terminal of a first FDSOI mixer transistor and a first source/drain terminal of a second FDSOI mixer transistor, each of the first and second FDSOI mixer transistors being electrically coupled to a respective back-gate direct current (DC) voltage source, wherein the first and second FDSOI mixer each include a gate terminal coupled to an input voltage, and wherein a second source/drain terminal of the first FDSOI mixer transistor and a second source/drain terminal of the second FDSOI mixer transistor of each mixer sub-stage is each electrically coupled to a respective mixer output node; applying a calibration code to the pair of SF sub-stages of the I-mixer assembly; determining whether a local oscillator (LO) leakage of the of the I-mixer assembly is at a low inflection point; in response to the LO leakage of the I-mixer assembly not being at the low inflection point, adjusting the calibration code to the pair of SF sub-stages of the I-mixer assembly; in response to the LO leakage of the I-mixer assembly being at the low inflection point, freezing the calibration code to the pair of SF sub-stages of the I-mixer assembly; applying a calibration code to the pair of SF sub-stages of the Q-mixer assembly, after freezing the calibration code to the pair of SF sub-states to the I-mixer assembly; determining whether a local oscillator (LO) leakage of the of the Q-mixer assembly is at a low inflection point; in response to the LO leakage of the Q-mixer assembly not being at the low inflection point, adjusting the calibration code to the pair of SF sub-stages of the Q-mixer assembly; and in response to the LO leakage of the Q-mixer assembly being at the low inflection point, freezing the calibration code to the pair of SF sub-stages of the Q-mixer assembly.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 8 shows a schematic view of a transmitter apparatus according to embodiments of the disclosure.

FIG. 9 shows a comparison between output spectrum before and after calibrating a transmitter system according to embodiments of the disclosure.

Figure 1:
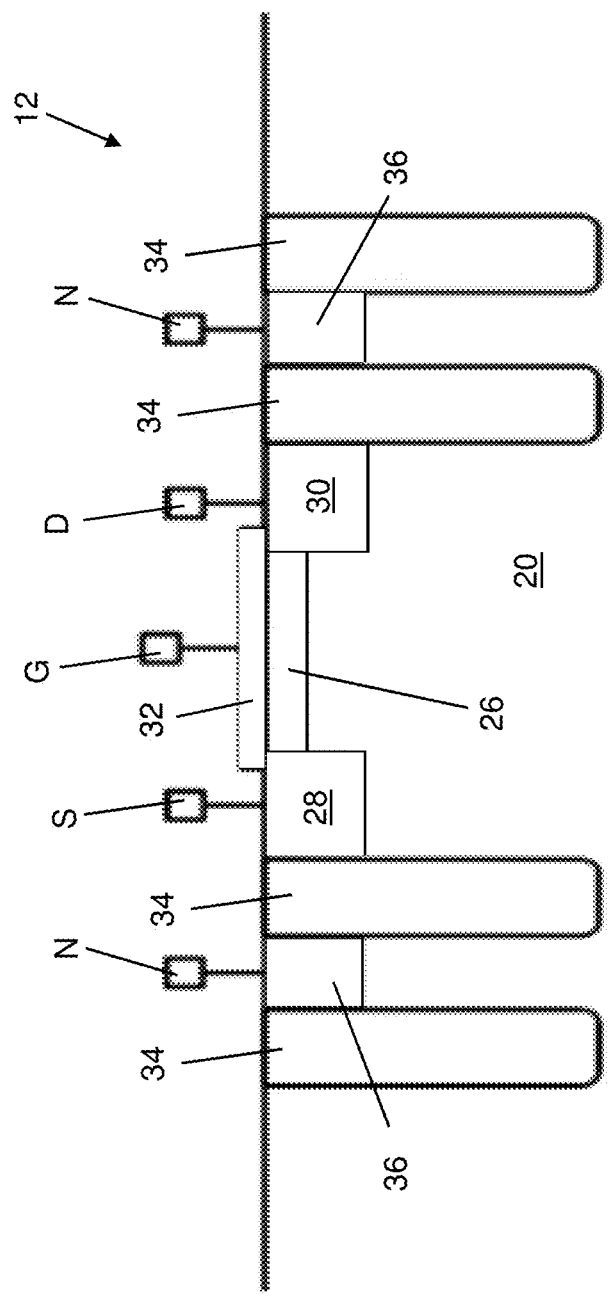
FIG. 1 shows a cross-sectional view of a conventional transistor structure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the disclosure relate to circuit structures and methods for transmitter devices, e.g., to adjust the frequency of a signal before transmission. Various embodiments of the disclosure can include incorporating fully depleted semiconductor on insulator (FDSOI) transistors into a transmitter device to provide a varied threshold voltage within a source follower (SF) stage (i.e., a type of current source in electronics engineering) and mixer stage (i.e., a component for combining an input signal and a local oscillator signal into a single output signal) of the device. In the art of integrated circuit technology, a "fully depleted" SOI device may be distinguished from conventional (i.e., "partially depleted" devices) by exhibiting a distinct channel structure. More specifically, a partially-depleted device is one in which the body thickness is thicker than the maximum depletion layer width in substrate 120 during device operation, and a fully-depleted device is one in which the body thickness is thinner than the maximum depletion layer width in substrate 120 during device operation. Consequently, during operation, partially depleted devices exhibit a "partial" depletion of the semiconductor body during operation, while fully depleted devices exhibit a "full" depletion thereof. As discussed herein, a "forward bias" generally refers to a voltage bias (e.g., a positive polarity voltage) at which the potential barrier (threshold voltage "$V_{th}$") at a p-n or metal-semiconductor junction (such as that within the body of a transistor) is lowered, and large current is allowed to flow from one region to another. A "reverse bias" generally refers to a voltage bias (e.g., a negative polarity voltage) at which the potential barrier ($V_{th}$) at the p-n or metal-semiconductor junction is increased and current flow from one region to another is restricted. Applying forward and reverse biasing voltages to back-gate regions can allow a user to control the operation of a transmitter device, e.g., to improve operational linearity and/or reduce the amount of parasitic capacitance and resistance of the transmitter. Various embodiments of the disclosure can also provide components and corresponding methodology for calibrating the back-gate voltage applied to the SF stage during operation. Embodiments of the disclosure can thus reduce the amount of power drawn by the transmitter (also known as "leakage power") by selectively reducing the threshold voltage for transistor devices in a transmitter assembly to approximately zero.

Referring to FIG. 1, a conventional transistor 12 is depicted as an example to emphasize structural and operational differences relative to embodiments of the present disclosure, and transistor elements included therein. Conventional transistor 12 may be fabricated, e.g., by way of conventional fabrication techniques which may operate on a bulk silicon substrate. Conventional transistor 12 thus may be formed in a substrate 20 including, e.g., one or more semiconductor materials. Substrate 20 can include any currently known or later-developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The entirety of substrate 20 or a portion thereof may be strained.

Source and drain nodes S, D of conventional transistor 12 may be coupled to regions of substrate 20 which include conductive dopants therein, e.g., a source region 28 and a drain region 30 separated by a channel region 26. A gate region 32 formed on channel region 26 can be coupled to a gate node G to control a conductive channel within channel region 26. A group of trench isolations 34 may be formed from electrically insulating materials such that regions 26, 28, 30 are laterally separated from parts of other transistors. As shown, trench isolations 34 form an insulating barrier between terminals 36 and regions 26, 28, 30 and/or other elements. Further features of each element in conventional transistor 12 (e.g., function and material composition) are described in detail elsewhere herein relative to similar components in an FDSOI transistor 102 (FIG. 2).

Figure 2:
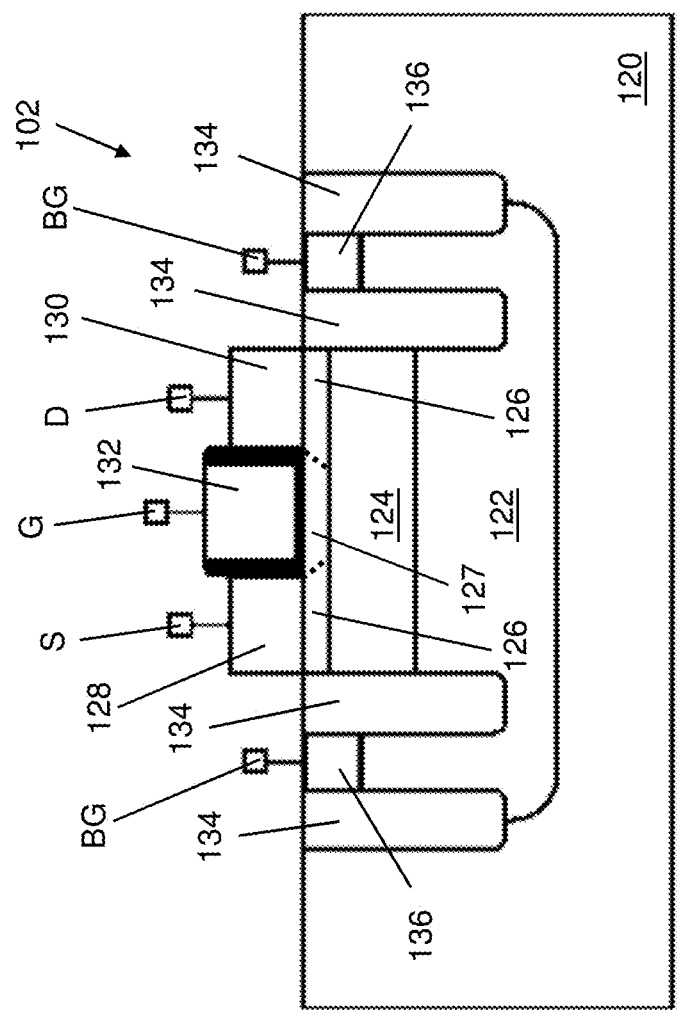
FIG. 2 shows a cross-sectional view of an FDSOI transistor structure with a back-gate region beneath a buried insulator layer according to embodiments of the disclosure.

Turning to FIG. 2, a cross-sectional view of a type of fully depleted semiconductor on insulator (FDSOI) transistor 102 which may be deployed, e.g., in structures and methods according to the disclosure, is shown. FDSOI transistor 102 can be formed with structural features for reducing the electrical resistance across source and drain terminals S, D thereof. FDSOI transistor 102 and components thereof can be formed on and within a substrate 120. Substrate 120 can include any currently known or later-developed semiconductor material including, without limitation, one or more of the example semiconductor materials described elsewhere herein relative to substrate 20 (FIG. 1). A back-gate region 122, alternatively identified as an n-type or p-typed doped well region, of substrate 120 can be implanted or formed in-situ during deposition with one or more doping compounds to change the electrical properties thereof. Doping generally refers to a process by which foreign materials ("dopants") are added to a semiconductor structure to alter its electrical properties, e.g., resistivity and/or conductivity. Where a particular type of doping (e.g., p-type or n-type) doping is discussed herein, it is understood that an opposite doping type may be implemented in alternative embodiments. Implantation refers to a process in which ions are accelerated toward a solid surface to penetrate the solid up to a predetermined range based on the energy of the implanted ions. Thus, back-gate region 122 can include the same material composition as the remainder of substrate 120, but can additionally include dopant materials therein. A buried insulator layer 124, also known in the art as a "buried oxide" or "BOX" layer, can separate back-gate region 122 of substrate 120 from source/drain regions 126 and a channel region 127 of FDSOI transistor 102. Buried insulator layer 124 therefore may be composed of one or more oxide compounds, and/or any other currently known or later-developed electrically insulative substances. FDSOI transistor 102 therefore can be embodied as a "fully-depleted semiconductor on insulator" (FDSOI) structure, distinguishable from other structures (e.g., conventional transistor 12 (FIG. 1)) by including buried insulator layer 124, back-gate nodes BG, etc., thereby allowing technical advantages such as an adjustable electric potential within back-gate region 122 of FDSOI transistor 102 as discussed elsewhere herein. Although FDSOI transistor 102 is shown and described as being formed with a particular arrangement of substrate 120, back-gate regions 122, and buried insulator layer 124, it is understood that FDSOI transistor 102 may alternatively be structured as a fin transistor, a nanosheet transistor, a vertical transistor, and/or one or more other currently-known or later-developed transistor structures for providing a back-gate terminal for adjusting the transistor's threshold voltage.

Source/drain regions 126 and channel region 127 may electrically couple a source terminal 128 of FDSOI transistor 102 to a drain terminal 130 of FDSOI transistor 102 when the transistor is in an on state. A gate stack 132 can be positioned over channel region 127, such that a voltage of gate node G controls the electrical conductivity between source and drain terminals 128, 130 through source/drain regions 126 and channel region 127. Gate stack 132 can have, e.g., one or more electrically conductive metals therein, in addition to a gate dielectric material (indicated with black shading between bottom of stack and channel region 127) for separating the conductive metal(s) of gate stack 132 from at least channel region 127. A group of trench isolations 134, in addition, can electrically and physically separate the various regions of FDSOI transistor 102 from parts of other transistors. Trench isolations 134 may be composed of any insulating material such as $SiO_2$ or a "high-k" dielectric having a high dielectric constant, which may be, for example, above 3.9. In some situations, trench isolations 134 may be composed of an oxide substance. Materials appropriate for the composition of trench isolations 134 may include, for example, silicon dioxide ($SiO_2$), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide ($ErO_x$), and other currently known or later-developed materials having similar properties.

Back-gate region 122 can be electrically coupled to back-gate node BG through back-gate terminals 136 within substrate 120 to further influence the characteristics of amplifier circuit 102, e.g., the conductivity between source and drain terminals 128, 130 through source/drain regions 126 and channel region 127. Applying an electrical potential to back-gate terminals 136 at back-gate node BG can induce an electric charge within back-gate region 122, thereby creating a difference in electrical potential between back-gate region 122 and source/drain regions 126, channel region 127, across buried insulator layer 124. Among other effects, this difference in electrical potential between back-gate region 122 and source/drain regions 126, channel region 127, of substrate 120 can affect the threshold voltage of FDSOI transistor 102, i.e., the minimum voltage for inducing electrical conductivity across source/drain and channel regions 126, 127 between source and drain terminals 128, 130 as discussed herein. In particular, applying a back-gate biasing voltage to back-gate terminals 136 can lower the threshold voltage of FDSOI transistor 102, thereby reducing source drain resistance and increasing drain current, relative to the threshold voltage of FDSOI transistor 102 when an opposite voltage bias is applied to back-gate terminals 136. This ability of FDSOI transistor 102, among other things, can allow a reduced width (saving silicon area) relative to conventional applications and transistor structures. In an example embodiment, a width of source/drain and channel regions 126, 127 (i.e., into and out of the plane of the page) can be between approximately 0.3 micrometers (μm) and approximately 2.4 μm. A length of source/drain and channel regions 126, 127 (i.e., left to right within the plane of the page) between source and drain terminals 128, 130 can be, e.g., approximately twenty nanometers (nm). FDSOI technology transistors, e.g., FDSOI transistor 102, offer the ability to apply a voltage bias to back-gate region 122 to manipulate the threshold voltage $V_t$ (i.e., minimum voltage for channel activation) of FDSOI transistor 102. As described herein, applying calibration voltages to back-gate region 122 can allow a user to reduce the local oscillator (LO) leakage and improve the linearity of an electronic transmitter. Back-gate region 122 can be coupled to an adjustable voltage to permit adjustment and calibration of the threshold voltage of FDSOI transistor 102. In circuit schematics shown in the accompanying FIGS. 3-4 and 6-8, any transistor which includes a back-gate terminal can be an embodiment of FDSOI transistor 102. Other transistors without back-gate terminals, by comparison, may alternatively take the form of any currently known or later developed transistor structure configured for use in a structure with FDSOI transistors 102.

Figure 3:
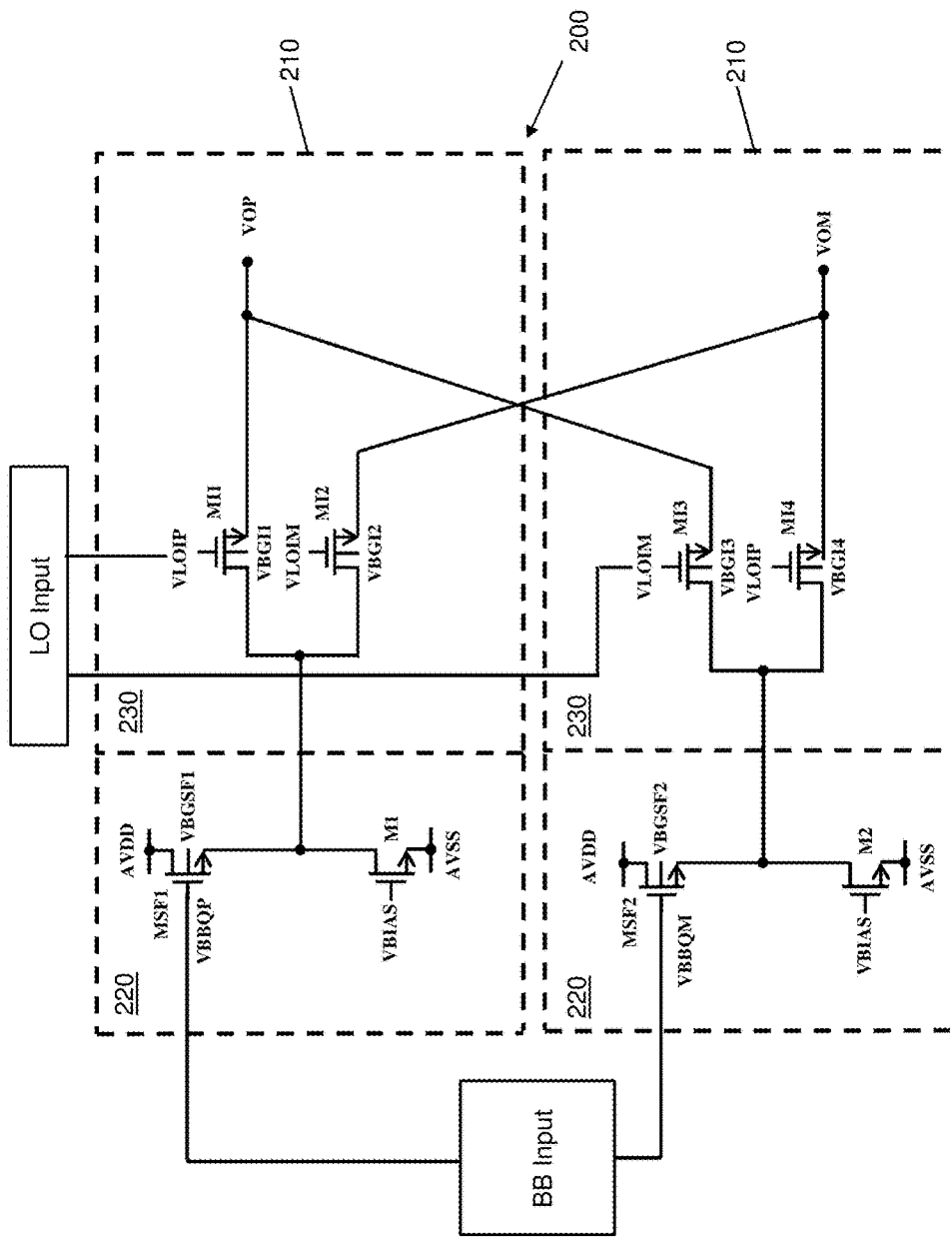
FIG. 3 shows a schematic view of a transmitter system according to embodiments of the disclosure.

Turning to FIG. 3, a transmitter system 200 is shown according to embodiments of the disclosure. As noted elsewhere herein, one or more embodiments of transmitter system 200 can be integrated into a transceiver or similar assembly to provide noise reduction and an increased output-to-input power ratio as compared to conventional devices. Transmitter system 200 can include at least one source follower-mixer assembly 210, e.g., to yield a higher-frequency output signal relative to a lower-frequency input signal. Although system 200 can include four or more assemblies 210 in most applications (e.g., to define pair of systems 200 for I-mixer and Q-mixer applications as discussed herein), two assemblies 210 are shown, e.g., to further emphasize the components included in each assembly 210. Each assembly 210 can include, e.g., a source follower (SF) sub-stage 220 to provide an electronic current source for a mixer sub-stage 230 for combining a set of local oscillator and input signals to produce a combined output signal, e.g., at a set of mixer output nodes. SF sub-stages 220 of assembly 210 can be structured to a baseband input signal ("BB input") assembly, and mixer sub-stages 230 of assembly 210 can correspondingly receive a local oscillator input ("LO input") assembly. As used herein, a baseband signal generally refers to a default alternating current (AC) signal source, into which electrical information can be embedded as signal variations (e.g., differences in amplitude, phase, frequency, etc.) relative to the baseline signal. Mixer sub-stage 230 of assembly 210 is shown to be structured as a passive device, e.g., a signal mixer structured to combine signals without the use of a DC-powered signal amplifier. Mixer sub-stage 230 can generally be considered to be a passive mixer regardless of whether the corresponding SF sub-stage 220 and/or LO assembly consumes a substantial amount of power.

As applied herein, "linearity" of transmitter system 200 or assembly 210 measures the relationship between the output RF signal from a transmitter and corresponding baseband signals, in light of a fixed LO input. In particular, the linearity of a transmitter generally denotes whether the RF signal from the transmitter corresponds to the corresponding baseband signal. In cases where the amplitude of the baseband signal is too large, the linearity of the transmitter will degrade. Linearity of transmitter system 200 can be measured by way of the variable "3BB," (see, e.g., FIG. 5) in which a higher magnitude value (e.g., a larger negative value) indicates a more linear performance of transmitter system 200.

SF sub-stage 220 can electrically specify a direct current (DC) voltage provided to mixer sub-stage 230, e.g., by acting as an electric current source. SF sub-stage 220 may have a distinct structure relative to conventional transmitter systems, e.g., by including embodiments of FDSOI transistor 102 therein. In a conventional SF sub-stage, the various transistors therein may include bulk silicon transistors with a source terminal of one transistor coupled to the bulk silicon material of the device. Such arrangements can carry operational disadvantages, e.g., significant limits on maximum operating frequency, reduced linearity between input and output voltages, parasitic capacitance of the source terminal through the connection to bulk silicon, etc. SF sub-stage 220 according to the disclosure, by contrast, can include a pair of transistors (M1, MSF1) with one transistor (e.g., MSF1) being structured in the form of FDSOI transistor 102. Transistor M1 can be coupled to a biasing voltage (VBIAS) at its gate terminal, and connected to an SF source voltage at its drain terminal. Transistor MSF1, however, can be connected to an input voltage (VBBQP) at its gate terminal, and electrically connected to the AVDD at its drain terminal.

The two transistors M1, MSF1 can also be electrically coupled to each other at a shared output node through their respective drain and source terminals, as shown. Although the arrangement of SF sub-stage 220 provides substantially the same electrical operation as a conventional bulk silicon SF sub-stage, the use of FDSOI transistor 102 for transistor MSF1 can provide distinct operational advantages. In particular, cross-coupling the output node of SF sub-stage 220 to back-gate terminal VBGSF1 can reduce the threshold voltage of transistor MSF1 (e.g., through automatic application of a forward or reverse bias thereto) without ceding transistor space to other elements such as bulk silicon couplings. The ability to provide a back-gate connection to transistor MSF1 can also provide related reductions in parasitic capacitance at the transistor's source terminal, as well as increased operating frequency and linearity.

Mixer sub-stages 230 of system 200 can also incorporate embodiments of FDSOI transistor 102 (FIG. 2) to provide operational advantages as compared to conventional devices. Mixer sub-stage 230 can include, e.g., a set of two transistors (e.g., nmos transistors and/or pmos transistors) acting as switches. Mixer sub-stages 230 can each include a corresponding set of differential LO input voltages, e.g., VLOIP/VLOIM for each mixer sub-stage 230. In a conventional mixer structure, each individual transistor in a mixer sub-stage may lack a back-gate terminal or otherwise include a back-gate connection to ground. According to embodiments, transistors MI1, MI2, MI3, MI4 can include back-gate terminals each coupled to a corresponding back-gate voltage VBGI1, VBGI2, VBGI3, VBGI4 to control the threshold voltage of each transistor in mixer sub-stages 230 during operation. Each back-gate voltage VBGI1, VBGI2, VBGI3, VBGI4 in mixer sub-stages 230 may be substantially the same, or may be distinct from one another. In particular, each pair of transistors in mixer sub-stages 230 can be structured such that a sufficient back-gate voltage will reduce the threshold voltage of the transistor to approximately zero. The input signal to transistors MI1, MI2, MI3, MI4 in each mixer sub-stage 230, i.e., gate voltage VLOIP/ VLOIM, can be provided through an LO assembly ("LO Input"). As shown, each transistor MI1, MI2, MI3, MI4 in each mixer sub-stage 230 can be electrically coupled to a corresponding mixer output node VOP, VOM, to define at least part of an output voltage from system 200. According to an embodiment, two mixer sub-stages 230 can define an "I mixer", while another two mixer sub-stages 230 can define a "Q mixer".

Figure 4:
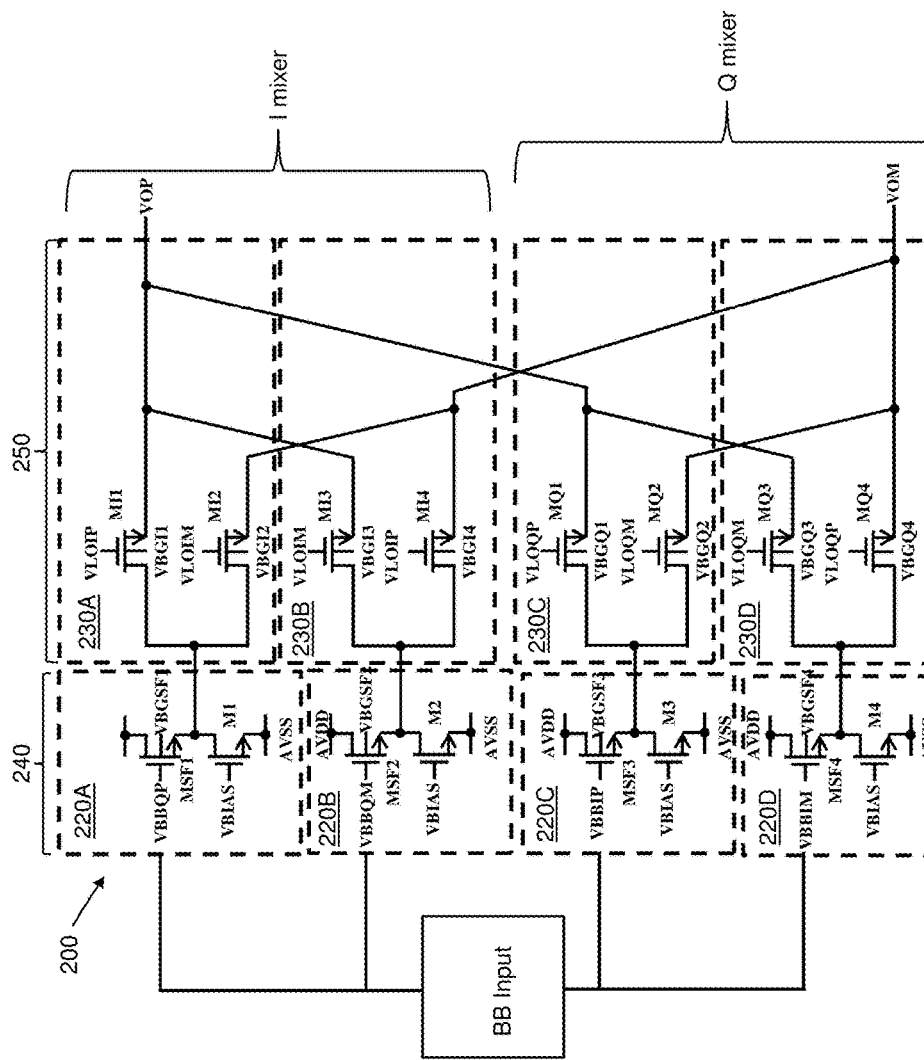
FIG. 4 shows a schematic view of another transmitter system according to embodiments of the disclosure.

Referring now to FIG. 4, a further embodiment of system 200 according to embodiments of the disclosure is shown. In this case, a group of SF sub-stages 220A, 220B, 220C, 220D (collectively, "SF sub-stages 220" hereafter) can together define a combination of I and Q SF stages 240 of system 200, while a group of mixer sub-stages 230A, 230B, 230C, 230D (collectively, "mixer sub-stages 230" hereafter) can together define a combination of I and Q mixer stages 250 of system 200. The LO input assembly of FIG. 3 is omitted from FIG. 4 and subsequent depictions of transmitter system 200 solely for clarity of illustration, and may be electrically coupled to terminals VLOIP, VLOIM, VLOQP, VLOQM, as discussed herein. SF stage 240 can thus provide a set of current sources for driving input signals to be mixed with the LO input signal to mixer stage 250. Mixer stage 250 can include a single set of output nodes VOP, VOM to provide an output signal than with a higher frequency than the various components of an input signal to mixer stage 250. Thus, each pair of transistors (e.g., transistors M1, MSF1) in a respective SF sub-stage 220 can make up one of four pairs of transistors in SF stage 240. Using SF sub-stage 220A as an example, each pair of transistors can include a biasing transistor (e.g., M1) coupled to a biasing voltage (VBIAS) at its gate terminal, and an FDSOI transistor (e.g., MSF1) coupled to an input signal (e.g., VBBQP) at its gate terminal, and a calibration voltage (e.g., VBGSF1) at its back-gate terminal. Each of the four pairs of transistors of SF stage 240 can further include a respective SF output node electrically coupled to a source/drain terminal of the biasing transistor (e.g., M1) and a source/drain terminal of the FDSOI transistor (e.g., MSF1). Thus, SF stage 240 can be associated with four output nodes each associated with a corresponding pair of transistors and/or SF sub-stage 220A. An input node to each mixer sub-stage 230 can electrically couple a corresponding output from one of the four pairs of transistors in SF stage 240 to a source/drain terminal of one FDSOI mixer transistor (e.g., MI1), and a source/drain terminal of another FDSOI mixer transistor (e.g., MI2) in one mixer sub-stage 230. The back-gate terminal of each FDSOI mixer transistor in mixer sub-stages 230 can be electrically coupled to a back-gate direct current (DC) voltage source, while the gate terminal can be electrically coupled to an input signal to mixer sub-stage 230. The other source/drain terminal of each FDSOI mixer transistor in mixer stage 250 can also be coupled to a corresponding output node. For instance, two transistors in each mixer sub-stage 230A, 230B, 230C, 230D can be coupled to output node VOP or output node VOM to yield portions of an output signal from mixer stage 250. The resulting output from a Q-mixer assembly relative to an I-mixer assembly can reflect, e.g., a ninety degree phase difference between signals.

Similar to SF sub-stages 220, each mixer sub-stage 230A, 230B, 230C, 230D can be associated with a group of similarly structured components to form one or more mixer stages 250. As noted elsewhere herein, each SF sub-stage 220 can define one of four sub-stages within mixer stage 240. Mixer sub-stages 230 can each be electrically coupled to the output from a corresponding SF sub-stage 220, thereby causing each SF sub-stage 220 to transmit a predetermined current to one mixer sub-stage 230. Within each mixer sub-stage, two FDSOI mixer transistors (e.g., MI1, MI2 of mixer sub-stage 230A) can be connected in parallel at respective source/drain terminals to the output node from the corresponding SF sub-stage 220A. The other source/drain terminal can similarly be electrically coupled to one of two output nodes VOP, VOM, of transmitter system 200. Each output node VOP, VOM can be connected to two of the four mixer sub-stages 230 (i.e., one I-mixer output and one Q-mixer output) to provide a mixed electrical output according to conventional principles for providing an electronic signal mixer. Embodiments of the present disclosure can be distinct from conventional mixers, however, in that each pair of FDSOI mixer transistors of each mixer sub-stage 230 can include back-gate terminals (as discussed relative to FDSOI transistor 102 (FIG. 2)) for controlling the threshold voltage of each transistor as described herein. To this extent, each FDSOI mixer transistor of each mixer sub-stage 230 can include one or more embodiments of FDSOI transistor 102.

The various back-gate terminals of each FDSOI mixer transistor in mixer sub-stages 230 can be electrically coupled to a corresponding back-gate direct current (DC) voltage source, e.g., represented by nodes VBGI1, VBGI2 of mixer sub-stage 230A, and corresponding nodes in mixer sub-stages 230B, 230C, 230D. The voltage applied to each back-gate terminal of each transistor of mixer sub-stages 230 can be adjustable to provide, e.g., a reduced or modified threshold voltage to control the operation of each mixer sub-stage 230 without the use an additional capacitor and/or resistor, as may be included in conventional mixer schemes. The back-gate terminal of each transistor in each mixer sub-stage 230 can be independently set and/or controlled to suit particular applications. Furthermore, due to manufacturing variations of each product unit and/or of a device structure, each transistor in mixer stage 250 can be calibrated individually through one or more automatic calibration algorithms as described herein. The gate of each transistor of each mixer sub-stage 230, in turn, can be electrically coupled to one of several inputs to be mixed within mixer stage 250, e.g., as indicated by nodes VLOIP, VLOIM, VLOQP, VLOQM. The inputs to each gate terminal in mixer sub-stages 230, in combination with the input current from SF stage 240 and back-gate voltages, can produce a mixed signal at two corresponding output nodes VOP, VOM. Relative to the signals input to transmitter system 200, the output signal at nodes VOP, VOM can have an increased or otherwise modified frequency pursuant to the general principles of an electrical signal converter and transmitter.

Figure 5:
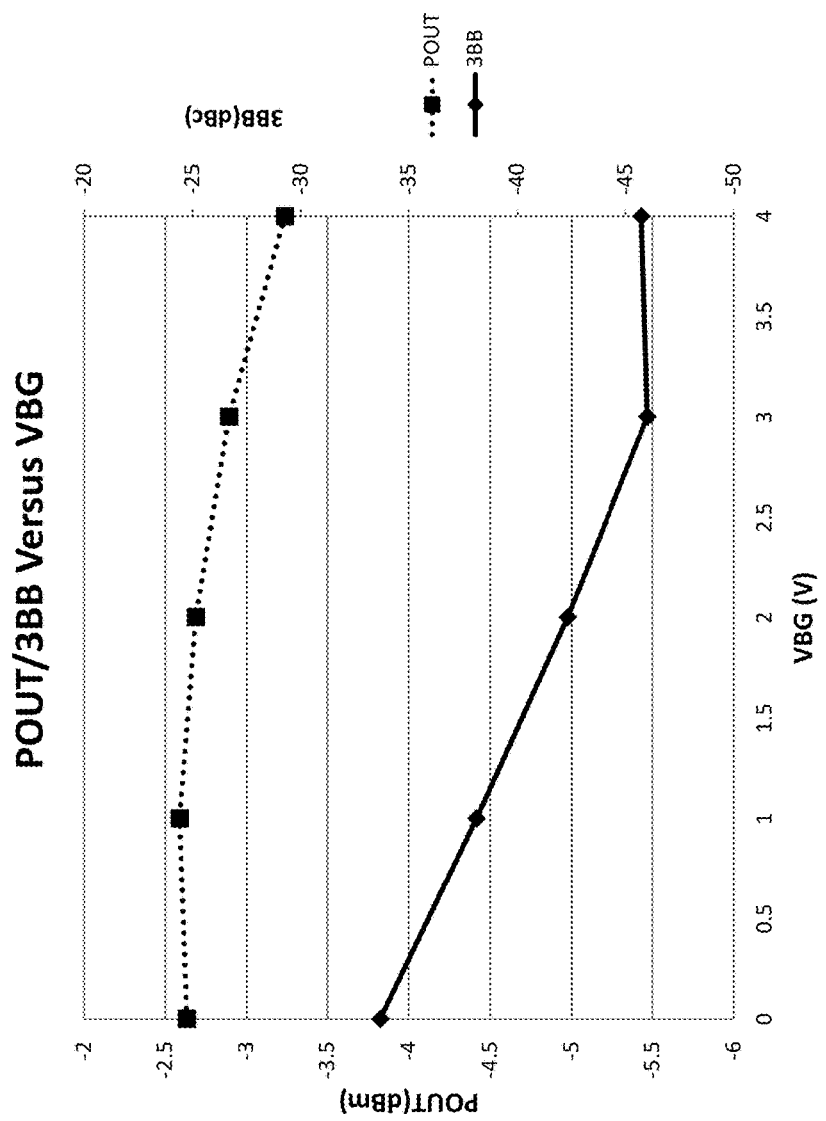
FIG. 5 shows a representative plot of output power and linearity (3BB) versus back-gate voltage in a transmitter system according to embodiments of the disclosure.

Referring now to FIGS. 4 and 5, a representative plot of output power (POUT) and linearity ("3BB") is shown relative to back-gate voltage in FIG. 5 to further illustrate operational features of the disclosure. In the example implementation depicted in FIG. 5, each transistor of mixer stage 250 can be electrically coupled to a single back-gate voltage source which varies from approximately zero volts (V) to approximately +4.0 V along X-axis. The plot shown in FIG. 5 thus correlates the amount of back-gate voltage applied to mixer stage 250 with the output power (POUT) for transmitter system 200, and linearity (3BB) of transmitter system 200. As noted elsewhere herein, a higher magnitude negative value for 3BB generally indicates a more linear performance of transmitter system 200. According to one possible implementation of transmitter system 200, a single input tone is input to a corresponding baseband signal. Where the back-gate voltage is approximately zero V, the signal frequency in the output may be include a power loss, e.g., signifying a substantially non-linear operation. As the back-gate voltage applied to mixer stage 250 increases, the linearity (3BB) of transmitter system 200 may increase gradually until reaching an approximate peak linearity at an approximately 3.0 V back-gate voltage. Despite this increase in back-gate voltage and improvement in linearity, the power output of transmitter system 200 may remain close or substantially equal to its initial level, e.g., between approximately −2.5 decibel-milliwatts ("dBm") and approximately −3.0 dBm. Thus, implementing transmitter system 200 with embodiments of FDSOI transistor 102 (FIG. 2) therein can improve the linearity of operation without significantly affecting the output power. For varied products and/or design requirements, the transistor sizes, DC bias, signal amplitudes, and/or back-gate voltage biases can be calibrated and/or optimized to further improve linearity and output power during operation.

Figure 6:
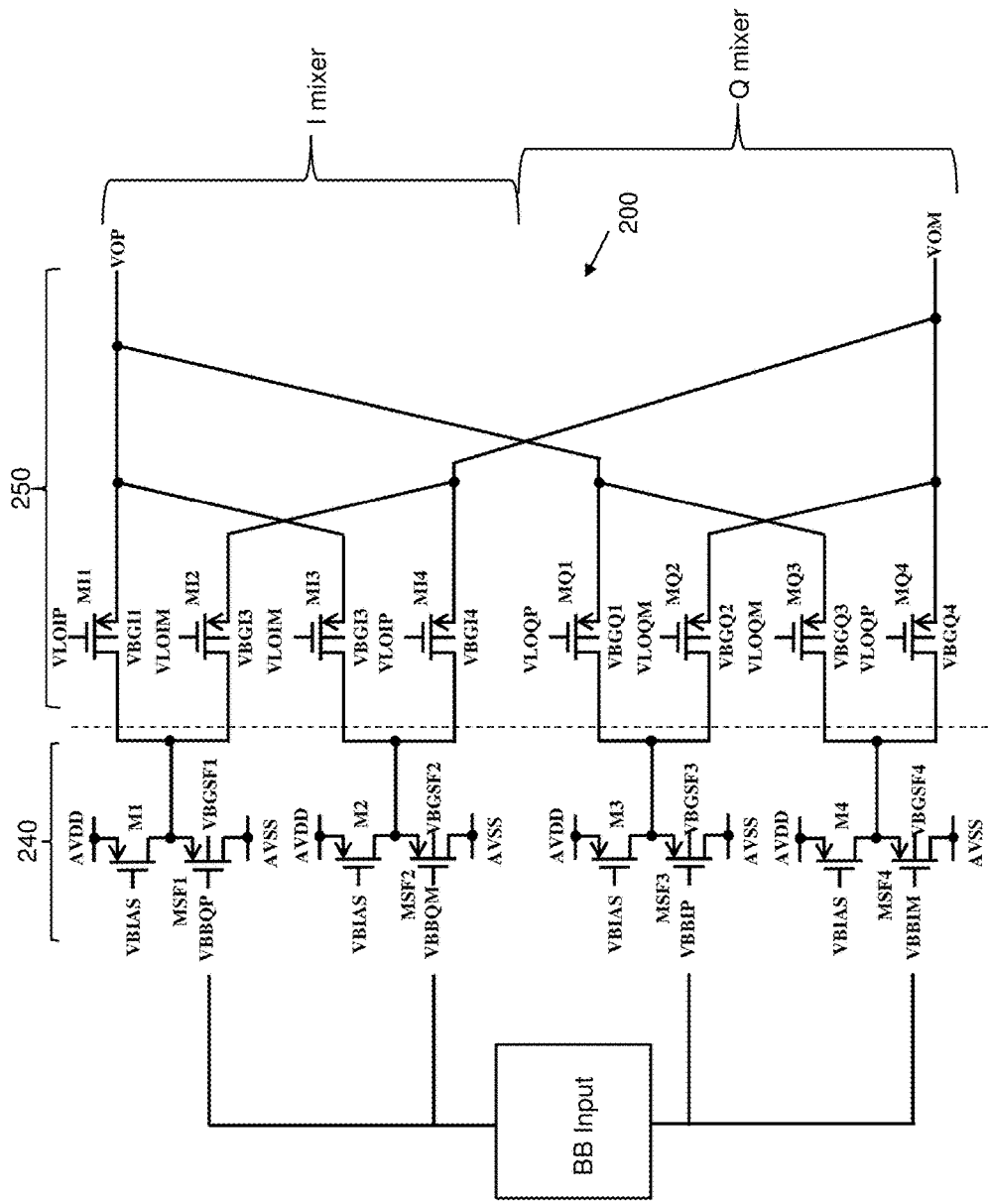
FIG. 6 shows a schematic view of a transmitter system with opposite polarity transistors according to embodiments of the disclosure.

Turning briefly to FIG. 6, further embodiments of transmitter system 200 can include a similar arrangement of components with differences in the underlying structure of each transistor therein. The various divisions between each SF sub-stage 220 (FIG. 4) and mixer sub-stage 230 (FIG. 4) are omitted in FIG. 6 solely for clarity of illustration. FIG. 6 demonstrates an alternative arrangement of pmos transistors to accommodate underlying differences in polarity and/or operation in a device structure. As shown in FIG. 6, each transistor of SF stage 240 is shown to include a set of pmos transistors, rather than nmos transistors in accordance with other embodiments discussed herein. Similarly, each transistor of mixer stage 250 can be substituted for an pmos-type FDSOI transistor 102 (FIG. 2) to accommodate opposite-polarity signals. In this arrangement the source and drain voltages AVSS, AVDD can be located at different terminals with respect to each pair of transistors, and with the location of each FDSOI transistor (e.g., MSF1, MSF2, MSF3, MSF4) being swapped with the location of each biasing transistor (M1, M2, M3, M4) where appropriate. Despite the change in polarity of each transistor in mixer stage 250, the location and electrical interconnections for each element therein may remain substantially unchanged as compared to nmos configurations (e.g., as shown in FIG. 4).

Figure 7:
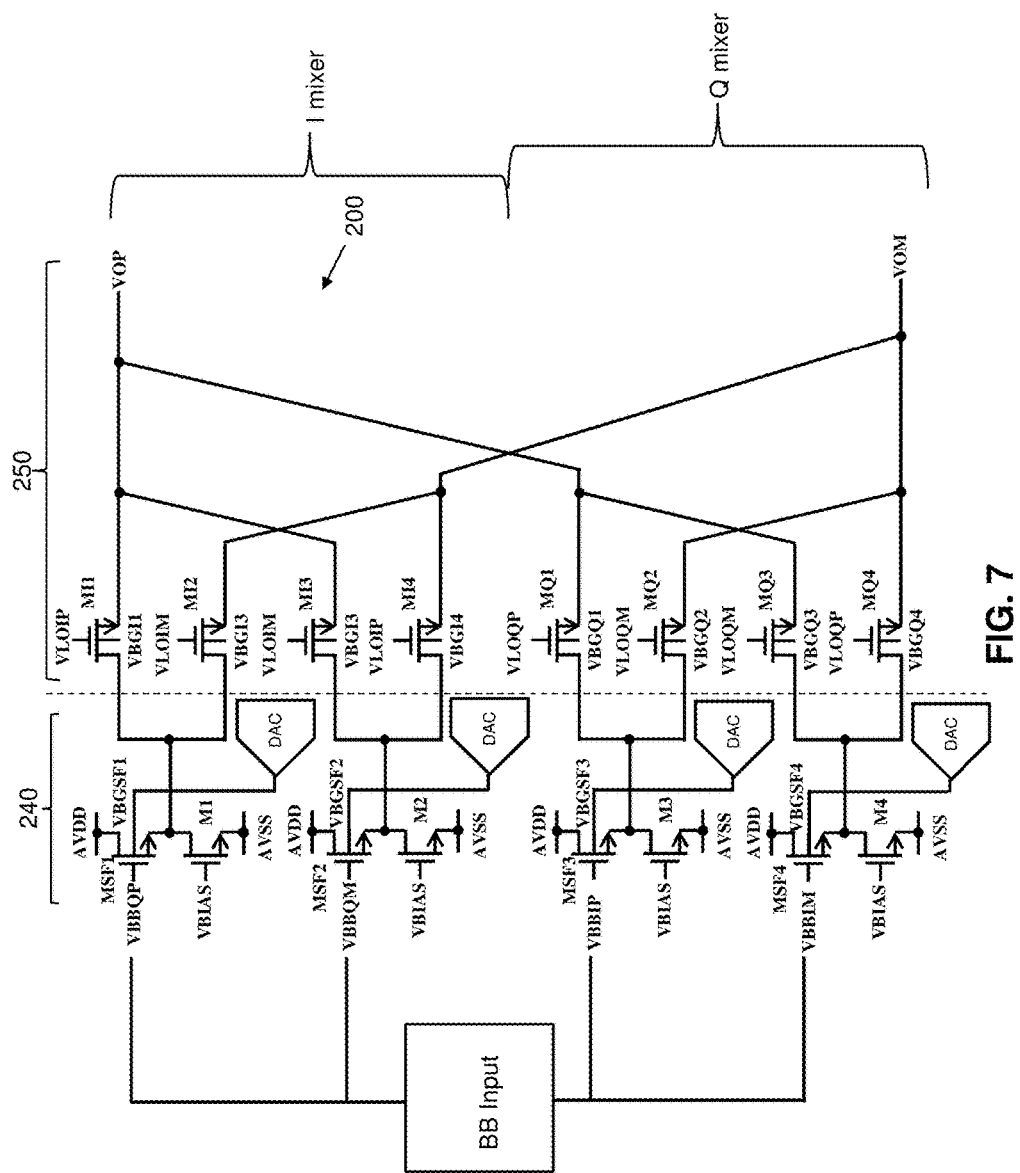
FIG. 7 shows a schematic view of a transmitter system with digital-to-analog converters (DAC) for controlling back-gate voltage according to embodiments of the disclosure.
Figure 10:
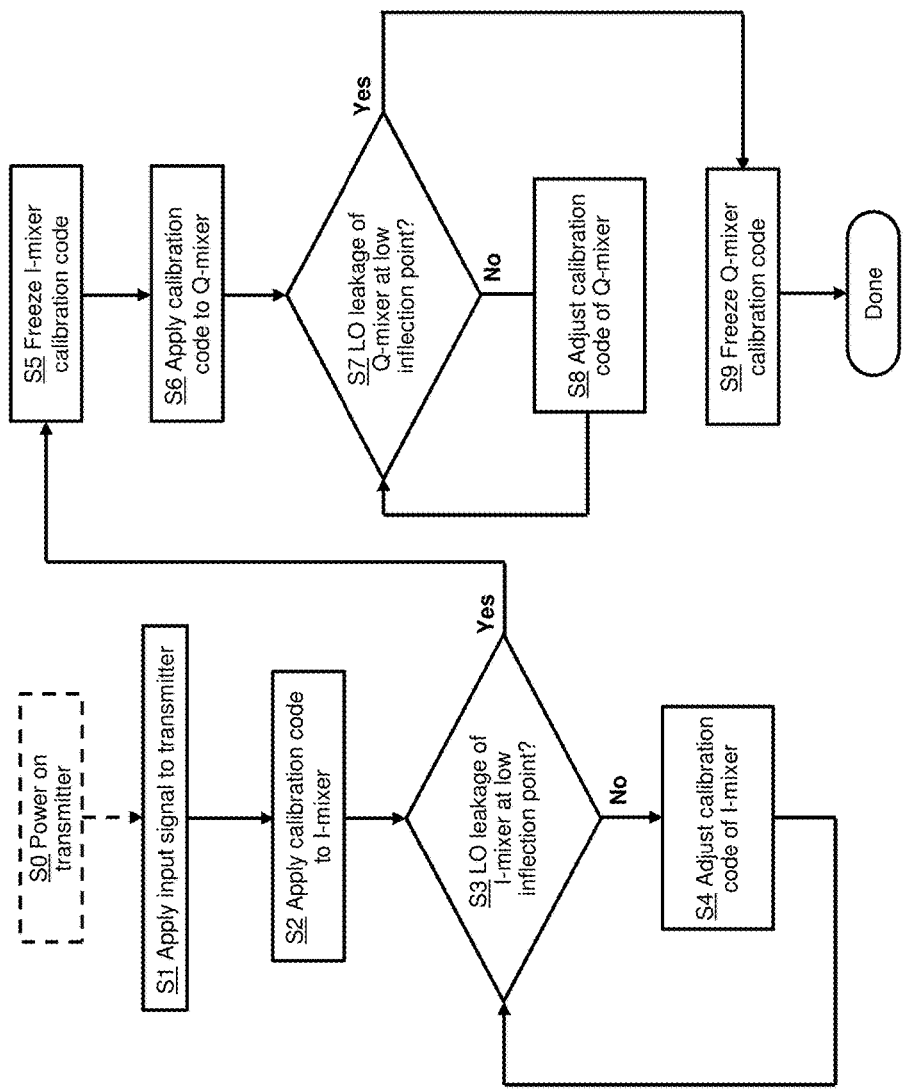
FIG. 10 shows an example of a process flow diagram for calibrating a transmitter system according to embodiments of the disclosure.

Turning to FIG. 7, a further implementation of transmitter system 200 is shown according to embodiments of the disclosure. Although transmitter system 200 is shown to be implemented with nmos transistors, e.g., in FIG. 4 and discussed elsewhere herein, it is understood that further embodiments of transmitter system 200 can include pmos transistors and the various additional elements discussed relative to FIG. 7. More specifically, transmitter system 200 can include a set of digital to analog converters (DACs) included within and/or otherwise electrically coupled to the FDSOI transistors (e.g., MSF1, MSF2, MSF3, MSF4) of SF stage 240. Each DAC can be electrically connected to a corresponding back-gate terminal of each FDSOI in SF stage 240, e.g., such that the various DACs connected to SF stage 240 control the back-gate voltage and corresponding threshold voltage of each FDSOI transistor.

According to embodiments, an operator can digitally signal each DAC to produce a corresponding analog output voltage, e.g., a forward or reverse back-gate bias of a selected magnitude, to reduce the threshold voltage of each FDSOI transistor in SF stage 240 to approximately zero. DACs in transmitter system 200 can thus serve as a calibrating tool to vary the operation of paired SF stages 240 (e.g., in an I mixer or Q mixer as discussed herein) and improve the linearity and/or performance of SF stage 240 without the implementation of conventional SF architectures, as discussed elsewhere herein. Thus, each DAC in transmitter system 200, where applicable, can be controlled by a single calibration component and/or control system, or may independently controlled to provide varied adjustment of each DAC. It is also understood that in further embodiments, additional DACs may be coupled to back-gate terminals of each transistor of mixer stage 250 to provide further variability and/or operational adjustment.

Referring now to FIG. 8, embodiments of the disclosure can provide a transmitter apparatus 300 with one or more embodiments of transmitter system 200 included therein. Transmitter system 200 is shown pursuant to the embodiment of FIGS. 4 and 7 described elsewhere herein, but may further include and/or be substituted for embodiments of transmitter system 200 shown in FIGS. 3, 6, and/or other embodiments discussed herein. Transmitter system 200 can be electrically coupled at its output terminals to a preamplifier circuit (simply "preamplifier" hereafter) 302, e.g., to increase the signal amplitude of output signals from transmitter system 200 and thereby define an RF output. Preamplifier 302 can generally take the form of one or more electrical components which converts an input signal into a stronger (i.e., higher amplitude) output signal, e.g., with sufficient gain to accommodate variances from noise or interference in subsequent processing. The output from preamplifier 302 can, in turn, be electrically connected to an output node ("RFOUT") from transmitter apparatus 300.

The various embodiments of transmitter apparatus 300 can include additional components for providing, e.g., a form of closed-loop control to periodically adjust the performance of transmitter system 200 as discussed herein. As shown, transmitter apparatus 300 can include a calibration engine 304 electrically coupled between the output from preamplifier 302 (and/or, optionally, the output from transmitter system 200) and a set of DACs 306 electrically coupled to back-gate terminals of each SF stage 240 (FIGS. 4, 6, 7) in an I-mixer and Q-mixer assembly. Calibration engine 304 thus may be electrically connected to DACs 306 such that calibration engine 304 may digitally adjust the output voltage from each DAC 306 applied to corresponding back-gate terminals. Calibration engine 304 may actuate DACs 306 in response to detecting and/or interpreting output signals yielded from transmitter system 200 and/or preamplifier 302. Calibration engine 304 itself may be a computerized, mechanical, or electro-mechanical device configured to adjust DACs 306 by transmitting calibration codes thereto, each calibration code being associated with an analogue voltage from a corresponding DAC 306.

In one embodiment, calibration engine 304 may be a computerized device capable of providing operating instructions (e.g., various digital signals) to DACs 306. In this case, calibration engine 304 may monitor the output from preamplifier 302 (and/or, optionally, transmitter system 200) by monitoring the power output, linearity, frequency, LO leakage, noise, and/or other electrical parameters of transmitter system 200 to provide operating instructions to DACs 306. For example, calibration engine 304 may send operating instructions to adjust the back-gate voltage applied from DACs 306 under certain operating conditions (e.g., to increase the operational linearity of transmitter system 200 at SF stage 240 (FIGS. 4, 6, 7) and/or mixer stage 250 (FIGS. 4, 6, 7)). In this case, DACs 306 may include electro-mechanical components configured to receive operating instructions (electrical signals) from calibration engine 304 and produce one or more predetermined voltages to back-gate terminals of FDSOI transistors 102 (FIG. 2) included within transmitter system 200. As noted elsewhere herein, calibration engine 304 can be configured to independently adjust each DAC 306 differently to produce independently adjusted back-gate voltages at each transistor. While described in several embodiments herein, calibration engine 304 may calibrate the analog voltage produced by DAC(s) 306 through any other conventional means.

Referring to FIGS. 8-9 together, embodiments of transmitter system 200 and/or transmitter apparatus 300 can be operable to reduce the LO leakage of transmitter system 200. As used herein, LO leakage generally is due to transistor mismatch, i.e., some portions of the LO signal wave being leak to the output. Such transistor mismatch may be associated with passive mixer components and/or source follower components due to inherent features of a passive mixer architecture. Conventional approaches for reducing LO leakage may involve changing the amount of DC voltage applied to the SF components. As noted herein, the ability to apply backgate biasing to the FDSOI transistors in each SF sub-stage can provide a more closely adjustable calibration of the mixer assembly. FIG. 9 therefore includes a "Before Calibration" plot of output power spectrum, in dBc, versus frequency for transmitter system 200 for the LO signal and output ("RF," for the RFOUT node) as compared to an "After Calibration" plot of the same properties. A larger difference between the RF and LO signals can indicate a lower LO leakage of a transmitter circuit. Initially, transmitter system 200 and/or apparatus 300 can operate with a relatively small difference dBc between RF and LO signals. Calibration engine 304 can then, as discussed herein, apply varying back-gate voltages to the I-mixer and Q-mixer of transmitter apparatus 300 to successively reduce the threshold voltage of each transistor therein, and thus reduce the amount of associated LO leakage. As shown in FIG. 9, calibration of transmitter system 200 with calibration engine 304 can reduce the LO leakage while maintaining the output signal RF at substantially its initial level (e.g., as discussed elsewhere herein relative to FIG. 5).

Turning to FIGS. 7-11 together, embodiments of the disclosure include methods for calibrating transmitter system 200 (FIGS. 4, 6-8), e.g., through the operation of transmitter apparatus 300 (FIG. 8) described herein. Methods according to the disclosure can include, e.g., adjusting the amount of forward or reverse back-gate voltage biases to back-gate nodes of each transistor of transmitter system 200 to reduce LO leakage of the complete device. As an initial process, embodiments of the disclosure can include powering on transmitter system 200 in process S0, shown in phantom to indicate an optional or initial step. Powering on or otherwise initiating operation of transmitter system 200 in process S0 can include, e.g., connecting a power supply to the device, powering on the device or entering a non-dormant operating mode, etc.

Methods according to the disclosure can include applying an input signal to respective input nodes of transmitter system 200 in process S1, e.g., after powering on transmitter system 200 in process S0. The input signal to transmitter system 200 can take the form of an AC waveform having information embedded therein, e.g., as variations from a baseline input signal to transmitter system 200 as noted herein. An operator may desire for transmitter system 200 to combine and increase the frequency of the input signals applied in process S1. As noted elsewhere herein, transmitter system 200 can include FDSOI transistors 102 (FIG. 2), each having a back-gate terminal for affecting the threshold voltage of the transistor structure during operation. After transmitter system 200 begins receiving input signal(s), the method discussed herein can include applying a calibration code to each SF sub-stage 220 of an I-mixer assembly, e.g., transistors MSF1 and MSF2 of SF sub-stage 220, in process S2. As may be apparent from the various processes discussed herein and operation of calibration engine 304 in transmitter apparatus 300, the first calibration code applied in process S2 can be a predetermined initial voltage, or "mid-code," (depicted in FIG. 11) for the corresponding DACs 306. For example, where each DAC 306 is configured to provide up to one-hundred and twenty-eight distinct analog voltages, the mid-code may be the voltage associated with code number sixty-four (represented, e.g., as a binary number). Thus, the specific code and corresponding voltage applied in process S2 may be the middle number associated with a particular DAC architecture. Thus, an operator and/or components of calibration engine 304 can select the mid-code and corresponding initial voltage to begin calibrating the I-mixer of transmitter apparatus 300 according to embodiments of the disclosure. As shown by example in FIG. 11, the amount of LO leakage associated with a particular mid-code may not correspond to a low inflection point (i.e., minimum amount of LO leakage) to be achieved through calibration.

As noted herein, each SF sub-stage 220 can be calibrated in methods according to the present disclosure in order to successively reduce or minimize the LO leakage of each I-mixer and Q-mixer in transmitter apparatus 300. At process S3, calibration engine 304 and/or an operator of transmitter apparatus 300 can determine whether the LO leakage of I-mixer in transmitter system 200 matches a low inflection point for the I-mixer. To determine whether the low-inflection point has been met in process S3, an operator of transmitter apparatus 300 and/or components of calibration engine 304 can identify or predict whether increasing or increasing the calibration code to DAC(s) 306 of the I-mixer will increase or decrease the amount of LO leakage. If neither code would decrease the amount of LO leakage, then the low inflection point has been met. If increasing or decreasing the calibration code will further reduce the LO leakage of the I-mixer, then the low inflection point for the I-mixer has not been met.

In situations where the calibration code applied in process S2 does not meet the low inflection point (i.e., "No" at process S3), the method can proceed to process S4 of adjusting the calibration code applied to DACs 306 of the I-mixer. The adjusting of calibration voltage in process S4 can include, e.g., determining whether increasing or decreasing the calibration code will provide a reduction in LO leakage for the I-mixer, than then increasing or decreasing the calibration code in accordance with this determination. The various processes applied herein thus assume that a single low inflection point will appear over the range of possible calibration codes to be applied to the I-mixer. Calibration engine 304 of transmitter apparatus 300 can then re-examine, after adjusting the calibration code in process S4, whether the LO leakage for the newly applied code corresponds to the low inflection point by again identifying whether a further adjustment (i.e., increase or decrease) to the calibration code will further reduce the LO leakage of the I-mixer in process S3. It is thus understood that in embodiments of the disclosure, processes S3 and S4 can repeat in a looping fashion by continuing to adjust the calibration codes to the I-mixer, e.g., by single binary digits.

Where the LO leakage of transmitter system 200 reaches the low inflection point (i.e., "Yes" at process S3) methods according to the disclosure can include proceeding to process S5 of freezing the calibration code for SF sub-stages 220 of the I-mixer in transmitter apparatus 300. The LO leakage being at the low inflection point in process S3 can occur, e.g., after repeated adjusting of the calibration codes to DACs 306 in process S4 as noted herein. Freezing the calibration codes to the I-mixer of transmitter apparatus 300 in process S5 can cause, e.g., DACs 306 to maintain a substantially constant analog voltage to each SF sub-stage 220. In any case, SF sub-stages 220 can continue to operate with the maintained calibration voltage until transmitter apparatus 300 ceases operating and/or until a future recalibration. As shown, the method can then continue to process S6 of applying a calibration code to DACs 306 of the Q-mixer in transmitter apparatus 300. The applied calibration code in process S6 can initially include applying a mid-code to the Q-mixer in a similar fashion to the initial code applied in process S2.

Figure 11:
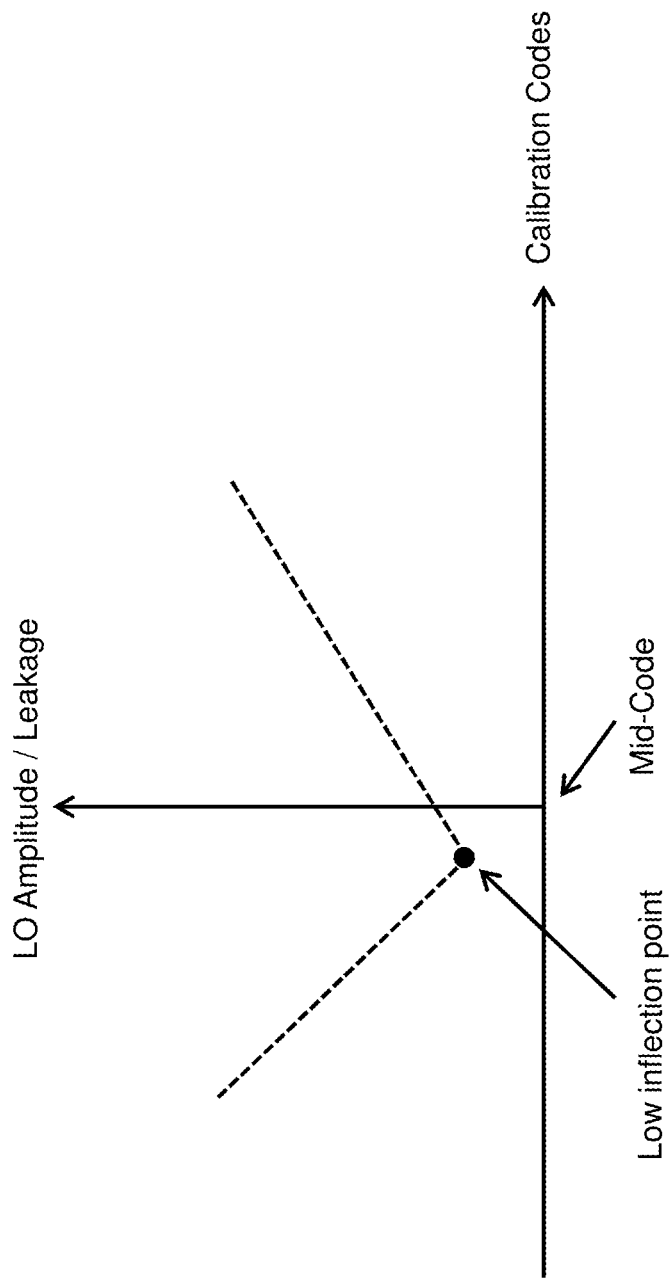
FIG. 11 shows an example plot of local oscillator amplitude/leakage versus DAC calibration codes according to methods of the disclosure.

After applying a mid-code to the Q-mixer in process S6, the flow can proceed to calibration of the Q-mixer assembly, e.g., by determining whether the LO leakage of the Q-mixer is at its low inflection point (e.g., as shown by example in FIG. 11). As with the calibration of an I-mixer assembly, embodiments of the present disclosure can assume that the LO leakage profile for each calibration code follows a substantial V-shape with a single low inflection point. Determining whether the LO leakage is at its low inflection point in process S7 can include, e.g., determining whether increasing or decreasing the calibration code will further reduce the amount of LO leakage in the Q-mixer of transmitter apparatus 300. In cases where increasing or decreasing the calibration code from its current level will reduce the amount of LO leakage (i.e., "No" at process S7), the flow can proceed to process S8 of adjusting the calibration code to the Q-mixer to provide the anticipated reduction in LO leakage. Where a particular calibration code to the Q-mixer produces the low inflection point of LO leakage (i.e., "Yes" at process S7), the flow can proceed to process S9 of freezing the Q-mixer calibration code to maintain the low inflection point of LO leakage for transmitter apparatus 300. The flow can then conclude ("Done") with respect to the calibrated I-mixer and Q-mixer components, e.g., until a recalibration, or until a desire wishes to similarly calibrate other I-mixer and Q-mixer components of a device.

Processes S1-S9 generally represent processes for calibrating, in turn, an I-mixer and Q-mixer of one transmitter apparatus 300 according to embodiments of the disclosure. In addition or alternatively, the various processes discussed herein relative to one transmitter apparatus 300 can also be implemented with respect to multiple I-mixers and Q-mixers of a single transmitter apparatus 300, or multiple transmitter apparatuses 300 where applicable. However implemented, the various methods for calibrating transmitter apparatus 300 may be implemented without departing from the general principles and operational methodology discussed herein relative to the circuit architectures specifically contemplated. Technical effects of implementing methods according to the disclosure can thus include reducing LO leakage in transmitter apparatus 300 to a minimum level, e.g., by calibrating the I-mixer and Q-mixer components of a particular device, in addition to selectively providing a reduced threshold voltage for transistors in transmitter system 200 during operation. The various structures and methods described herein can allow additional circuit elements omitted to save corresponding space in a device, e.g., by removing resistive and capacitive elements conventionally used to provide the DC voltage, current source or driver, etc., for a passive mixer.

The flowcharts and block diagrams in the Figures illustrate the layout, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A transmitter system comprising:
a source follower (SF) sub-stage having a pair of transistors electrically coupled to each other at an SF output node via respective source/drain terminals, wherein one transistor of the pair of transistors is coupled to a biasing voltage at a gate terminal thereof, and wherein another transistor of the pair of transistors comprises a fully depleted semiconductor on insulator (FDSOI) transistor coupled to an input signal at a gate terminal thereof, and coupled to a calibration voltage at a back-gate terminal thereof; and
a mixer sub-stage having a mixer input node coupled to the SF output node of the pair of transistors of the SF sub-stage, wherein the mixer input node is electrically coupled in parallel to a first source/drain terminal of a first FDSOI mixer transistor and a first source/drain terminal of a second FDSOI mixer transistor, each of the first and second FDSOI mixer transistors being electrically coupled to a respective back-gate direct current (DC) voltage source, wherein the first and second FDSOI mixer transistors each include a gate terminal coupled to an input voltage, and wherein a second source/drain terminal of the first FDSOI mixer transistor and a second source/drain terminal of the second FDSOI mixer transistor of the mixer sub-stage are each electrically coupled to a mixer output node.

2. The transmitter system of claim 1, wherein the pair of transistors of the SF sub-stage comprises one of four pairs of transistors of an SF stage, each of the four pairs of transistors including: a biasing transistor coupled to the biasing voltage at a gate terminal thereof; and a fully depleted semiconductor on insulator (FDSOI) transistor coupled to a respective input signal at a gate terminal thereof, and a calibration voltage at a back-gate terminal thereof, wherein each of the four pairs of transistors includes a respective SF output node electrically coupled to a source/drain terminal of the biasing transistor and a source/drain terminal of the FDSOI transistor.

3. The transmitter system of claim 2, wherein the first and second FDSOI mixer transistors of the mixer sub-stage define one of four sub-stages within a mixer stage, wherein the input node to each mixer sub-stage electrically couples a corresponding SF output node from one of the four pairs of transistors to a source/drain terminal of the first FDSOI mixer transistor and a source/drain terminal of the second FDSOI mixer transistor of one of the four sub-stages, each of the first and second FDSOI mixer transistors being electrically coupled to a respective back-gate direct current (DC) voltage source, wherein each of the first and second FDSOI mixer transistors of each mixer sub-stage include a gate terminal electrically coupled to a respective mixer input, and wherein another source/drain terminal of each of the first and second FDSOI mixer transistors is electrically coupled to a respective mixer partial output node.

4. The transmitter system claim 3, further comprising a first transmitter output and a second transmitter output, wherein the first transmitter output is electrically coupled to the output node of the first FDSOI mixer transistor in each mixer sub-stage, and wherein the second transmitter output is electrically coupled to the output node of the second FDSOI mixer transistor in each mixer sub-stage.

5. The transmitter system of claim 1, wherein the back-gate terminal of the FDSOI transistor of the SF sub-stage is electrically coupled to an output node from a digital-to-analog converter (DAC).

6. The transmitter system of claim 5, wherein the DAC is electrically coupled to a calibration engine for the transmitter system, the calibration engine being configured to transmit a calibration code to the DAC to yield the calibration voltage.

7. The transmitter system of claim 1, wherein the SF sub-stage and the mixer sub-stage are configured to produce a higher frequency output signal, relative to a frequency of the input signal.

8. A transmitter apparatus comprising:
a transmitter system having an I-mixer assembly and a Q-mixer assembly therein, and wherein the I-mixer assembly and the Q-mixer assembly each include:
a pair of source follower (SF) sub-stages each having a pair of transistors electrically coupled to each other at an SF output node via respective source/drain terminals, wherein one transistor of the pair of transistors is coupled to a biasing voltage at a gate terminal thereof, and wherein another transistor of the pair of transistors comprises a fully depleted semiconductor on insulator (FDSOI) transistor coupled to an input signal at a gate terminal thereof, and coupled to a calibration voltage at a back-gate terminal thereof, and a pair of mixer sub-stages each having a mixer input node coupled to the SF output node of the pair of transistors of a respective SF sub-stage, wherein the mixer input node is electrically coupled in parallel to a first source/drain terminal of a first FDSOI mixer transistor and a first source/drain terminal of a second FDSOI mixer transistor, each of the first and second FDSOI mixer transistors being electrically coupled to a respective back-gate direct current (DC) voltage source, wherein the first and second FDSOI mixer each include a gate terminal coupled to an input voltage, and wherein a second source/drain terminal of the first FDSOI mixer transistor and a second source/drain terminal of the second FDSOI mixer transistor of each mixer sub-stage is each electrically coupled to a respective mixer output node;
a preamplifier having an amplification input electrically coupled to the mixer output node of the I-mixer assembly and the Q-mixer assembly, wherein an output from the preamplifier defines an amplification output node; and
a calibration engine electrically coupled to the amplification output node, wherein the calibration engine transmits a forward bias or a reverse bias as the calibration voltage to the SF sub-stage based on output signal at the amplification output node.

9. The transmitter apparatus of claim 8, wherein the calibration engine further includes a digital-to-analog converter (DAC) configured to supply the forward bias or the reverse bias as the calibration voltage to the transmitter system based on output signal at the amplification output node.

10. The transmitter apparatus of claim 9, wherein the calibration engine is further configured to transmit a calibration code to the DAC to yield the calibration voltage.

11. The transmitter apparatus of claim 10, wherein the calibration engine is further configured to increase or decrease a bit value of the calibration code based on the output signal at the amplification output node.

12. The transmitter apparatus of claim 11, wherein the calibration engine is further configured to freeze the calibration code in response to detecting a low inflection point of local oscillator (LO) leakage at the amplification output node.

13. The transmitter apparatus of claim 9, wherein the DAC comprises one of a plurality of DACs each connected to a pair of SF sub-stages of the transmitter system.

14. The transmitter apparatus of claim 8, wherein the source follower sub-stage and the mixer sub-stage are configured to produce a higher frequency output signal to the amplification input of the preamplifier, relative to a frequency of the input signal.

15. A method for calibrating a transmitter system, the method comprising:
applying an input signal to an input node of the transmitter system, wherein the transmitter system includes an I-mixer assembly and a Q-mixer assembly, and wherein the I-mixer assembly and the Q-mixer assembly each include:
a pair of source follower (SF) sub-stages each having a pair of transistors electrically coupled to each other at an SF output node via respective source/drain terminals, wherein one transistor of the pair of transistors is coupled to a biasing voltage at a gate terminal thereof, and wherein another transistor of the pair of transistors comprises a fully depleted semiconductor on insulator (FDSOI) transistor coupled to an input signal at a gate terminal thereof, and coupled to a calibration voltage at a back-gate terminal thereof, and a pair of mixer sub-stages each having a mixer input node coupled to the SF output node of the pair of transistors of a respective SF sub-stage, wherein the mixer input node is electrically coupled in parallel to a first source/drain terminal of a first FDSOI mixer transistor and a first source/drain terminal of a second FDSOI mixer transistor, each of the first and second FDSOI mixer transistors being electrically coupled to a respective back-gate direct current (DC) voltage source, wherein the first and second FDSOI mixer each include a gate terminal coupled to an input voltage, and wherein a second source/drain terminal of the first FDSOI mixer transistor and a second source/drain terminal of the second FDSOI mixer transistor of each mixer sub-stage is each electrically coupled to a respective mixer output node;

applying a calibration code to the pair of SF sub-stages of the I-mixer assembly;

determining whether a local oscillator (LO) leakage of the of the I-mixer assembly is at a low inflection point;

in response to the LO leakage of the I-mixer assembly not being at the low inflection point, adjusting the calibration code to the pair of SF sub-stages of the I-mixer assembly;

in response to the LO leakage of the I-mixer assembly being at the low inflection point, freezing the calibration code to the pair of SF sub-stages of the I-mixer assembly;

applying a calibration code to the pair of SF sub-stages of the Q-mixer assembly, after freezing the calibration code to the pair of SF sub-states to the I-mixer assembly;

determining whether a local oscillator (LO) leakage of the of the Q-mixer assembly is at a low inflection point;

in response to the LO leakage of the Q-mixer assembly not being at the low inflection point, adjusting the calibration code to the pair of SF sub-stages of the Q-mixer assembly; and in response to the LO leakage of the Q-mixer assembly being at the low inflection point, freezing the calibration code to the pair of SF sub-stages of the Q-mixer assembly.

16. The method of claim 15, wherein applying the calibration code to the pair of SF sub-stages of the I-mixer assembly or the Q-mixer assembly includes applying an initial code, and wherein adjusting the calibration code to the I-mixer assembly or the Q-mixer assembly includes increasing or decreasing a value of the initial code.

17. The method of claim 16, wherein the transmitter system further includes a digital-to-analog converter (DAC) configured to supply the forward bias or the reverse bias to the I-mixer assembly or the Q-mixer assembly, based on the calibration code.

18. The method of claim 16, wherein the transmitter system further includes a calibration engine configured to apply and adjust the calibration codes based on an output from the I-mixer assembly and an output from the Q-mixer assembly.

19. The method of claim 16, wherein determining whether the local oscillator (LO) leakage of the I-mixer assembly or the Q-mixer assembly is at a low inflection point includes:

determining whether the LO leakage is greater than the LO leakage for a known calibration code; and determining whether to increase or decrease the value of the initial code, based on whether the LO leakage is greater than the LO leakage for the known calibration code.

20. The method of claim 15, further comprising identifying the low inflection point based on a plurality of previously-applied calibration codes.

* * * * *